US006373171B1

(12) United States Patent
De Lange et al.

(10) Patent No.: US 6,373,171 B1
(45) Date of Patent: Apr. 16, 2002

(54) DEVICE FOR ACCURATE POSITION CONTROL OF A FORCE-TRANSMITTING SYSTEM

(75) Inventors: Johannes De Lange, Beverwijk; Tamis Lambertus Maria Leek, Alkmaar; Johan Jacob Hendrick Wesselink, Velserbroek, all of (NL)

(73) Assignee: Corus Technology BV, Ca Ijmuiden (NL)

( * ) Notice: Subject to any disclaimer, the term of this patent is extended or adjusted under 35 U.S.C. 154(b) by 0 days.

(21) Appl. No.: 09/830,025
(22) PCT Filed: Oct. 21, 1999
(86) PCT No.: PCT/EP99/08139
§ 371 Date: Jul. 12, 2001
§ 102(e) Date: Jul. 12, 2001
(87) PCT Pub. No.: WO00/23204
PCT Pub. Date: Apr. 27, 2000

(30) Foreign Application Priority Data

Oct. 21, 1998 (NL) .............................. 1010366

(51) Int. Cl.[7] .............................................. H01L 41/08
(52) U.S. Cl. ....................................... 310/328; 310/348
(58) Field of Search ........................... 310/328, 323.01, 310/338, 339, 348

(56) References Cited

U.S. PATENT DOCUMENTS 3,216,231 A    11/1965  Granborg
3,582,691 A  *  6/1971  Sonderegger et al. ........ 310/338
4,705,323 A  * 11/1987  Imoto et al. ............. 310/328 X
4,765,140 A  *  8/1988  Imoto et al. ............. 310/328 X
5,780,958 A    7/1998  Strugach et al.
6,274,967 B1 *  8/2001  Zumstrull et al. .......... 310/328

FOREIGN PATENT DOCUMENTS

| EP | 0602492  | 6/1994  |
| JP | 06315282 | 11/1994 |
| JP | 07058370 | 3/1995  |
| JP | 07131085 | 5/1995  |
| JP | 07183586 | 7/1995  |
| JP | 07249802 | 9/1995  |

* cited by examiner

Primary Examiner—Mark O. Budd
(74) Attorney, Agent, or Firm—Stevens, Davis, Miller & Mosher, LLP

(57) ABSTRACT

Device for accurate position control of a force-transmitting system comprising at least one solid-state piezo actuator (7), wherein the piezo actuator (7) comprises a metal block (11) which is positioned between end plates (12, 13) and in the direction of the force has at least one duct (14) into each of which a stacked piezo element (15) fits. The height of the block (11) is shorter than the length of the piezo elements (15) and the difference in height corresponds to the shortening of the piezo elements (15) under the maximum permissible axial load acting thereon, and wherein the piezo actuator (7) is incorporated transversely to the direction of force, without play, in such a way into an element of the force-transmitting system that only a force in the axial direction of the ducts (14) can be transmitted to the piezo elements (15).

17 Claims, 2 Drawing Sheets

DEVICE FOR ACCURATE POSITION CONTROL OF A FORCE-TRANSMITTING SYSTEM

The invention relates to a device for accurate position control of a force-transmitting system comprising at least one solid-state piezo actuator. The European Patent EP 0602492 discloses a cluster mill where piezo actuators are used to control the roll bending of a back-up roll. Apart from this specific application to a cluster mill, the use of piezo actuators is also conceivable for a variety of other devices where accurate position control of a force-transmitting system is desirable. In the present application, the invention will be described specifically with reference to the use in cold- or hot-rolling of metal strip. The invention is not, however, limited to this field of application.

As a rule, the rolling force is applied by means of hydraulic systems or electrically driven threaded spindles. A drawback of these systems resides in the fact that a relatively long time is required to achieve a specific deflection of the positioning system and that the positioning accuracy is relatively low. The primary purpose of using piezo actuators is to be capable of rapidly achieving a specific desired deflection of the position control system. Another objective is to be capable of more accurately achieving a predetermined desired deflection of the position control system. Further advantages of the use of a piezo actuator are generally known.

As well as advantages, the use of piezo actuators also clearly carries drawbacks, however. One drawback resides in the fact that piezo elements are able to withstand only a limited axial load. Whilst there is still considerable uncertainty concerning this issue, it is nevertheless assumed that an axial load of a circular piezo element having a diameter of about 50 mm should not exceed 75 kN. Particularly where thickness control in the rolling of steel is concerned, unexpected peaks in the rolling force may occur, which could lead to serious damage to the piezo elements.

Another problem in using piezo elements resides in the fact that piezo elements must be subjected to very purely axial loads and are very sensitive to damage in the event of deviations from the purely axial load.

It is therefore an object of the invention to provide a device which allows all the desired advantages of the use of piezo actuators to be utilized while avoiding the consequences of the drawbacks attendant upon said use. Other advantages resulting from the use of the novel device, while drawbacks are avoided, are clarified hereinafter.

The device according to the invention is then, firstly, characterized in that the piezo actuator comprises a metal block which is positioned between end plates and in the direction of the force has at least one duct into each of which a stacked piezo element fits, the height of the block being shorter than the length of the piezo elements and the difference in height corresponding to the shortening of the piezo elements under the maximum permissible axial load acting thereon, and in that the piezo actuator is incorporated transversely to the direction of force, without play, in such a way into an element of the force-transmitting system it is possible to ensure that only a force in the axial direction of the ducts can be transmitted to the piezo elements. It should be noted in this context that a stacked piezo element is understood to be a number of loose piezo elements which are stacked to form a rod-shaped body and are formed into a unit, for example by means of gluing. As a result of the stacked piezo elements being placed into a duct, it can be positioned in such a way that the direction in which it may be loaded accurately matches the force direction of the system. If the transmitted force threatens to exceed the permissible maximum, the stacked piezo elements are compressed to such an extent that they no longer project beyond the block. From then onwards, the block will absorb the axial force and in so doing protect the piezo elements owing to the fact that the block has a very much higher stiffness than the piezo elements. In the process, the block, as it were, fulfils the function of a blocking spring.

In this arrangement, any transverse force is absorbed by this element without a transverse force being transmitted to the piezo elements.

It was found that fabrication of piezo elements and the stacking thereof may lead to slight differences in length between them. The differences in length can be reduced to less than 50 $\mu$m with the aid of shims. For the purpose of good force transmission by the actuator as a whole, at least one of the end plates can be constructed as a thrust bearing.

Cluster mills can be subject to differences in temperature, while cooling liquids are often used extensively. The operation of piezo elements is to some extent temperature-dependent, whilst they are also, regarding their service life, highly sensitive to excessive exposure to moisture. Moreover, the functioning of the metal block as a blocking spring depends greatly on its temperature, the reason for this being that the expansion coefficient of steel is larger, by about a factor of 3, than that of the ceramic piezo elements. It was found that all these drawbacks can be overcome, according to the invention, if the ducts within which the stacked piezo elements are located, are connected to a source of a gas for controlling the temperature and the humidity level within the ducts. As a rule, air will be used here. By supplying air under some excess pressure it has proven possible to avoid the ingress of splashed fluid as far as the piezo elements.

In the most ideal case, the rolling force can be completely absorbed by means of the piezo elements, allowing overloading to be avoided with the aid of the block within which these elements are located. Piezo elements are expensive, however, and take up space. If limited space is available for putting piezo elements into place, it is advantageous, according to the invention, for the piezo actuator to be also coupled to at least one bias spring, the bias force not being strongly dependent on the travel of the piezo actuator. By allowing part of the rolling force to be absorbed by one or more bias springs, the volume required for putting piezo elements into place can be kept smaller, costs also being limited at the same time. The use of bias springs having relatively low stiffness ensures that the bias force does not greatly depend on the travel of the piezo actuator, as a result of which the performance of the piezos is not greatly reduced by part of their function being allowed to be assumed by bias springs. As the bias springs do not require more than a very small travel, it is advisable for them to take the form of hydraulic membrane actuators. A packingless and maintenance-free design is thus obtained. These bias springs may also be given low stiffness by being coupled, for example, to a large buffer vessel for the hydraulic fluid.

A further aspect of the invention is that the piezo actuators and/or the bias springs are provided with height sensors. In this arrangement, signals coming from these height sensors can be added to the control system of the electrical actuation of the piezo elements and/or of the hydraulic actuation of the bias springs, this arrangement allowing the bias springs to be optimally activated in the range of the position control in which the piezo actuators function. The signal coming from the height sensors in the piezo actuators can be used directly for controlling the position controller.

The new device, in particular, proved to have good utility if the piezo actuator is incorporated in a bearing housing of a cluster mill.

The invention will now be explained with reference to a few figures.

FIG. 1 schematically shows the location and the action of a piezo actuator in a cluster mill.

Figure 1:
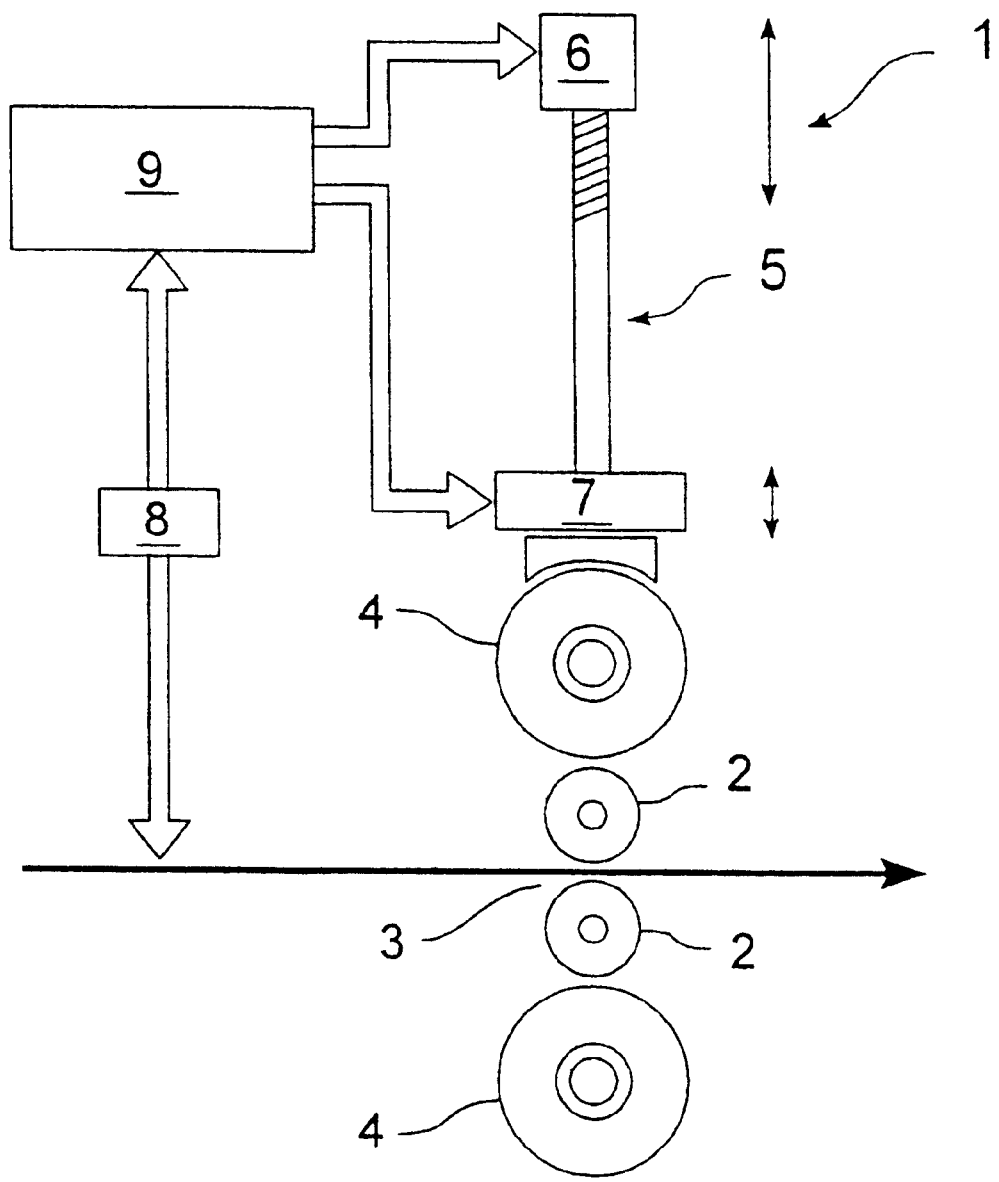

FIG. 1 schematically shows a side view of rolling installation 1, which is constructed in accordance with the invention. This rolling installation 1 is largely of conventional design as used for rolling a strip of aluminium or steel. Two work rolls 2 define a roll gap 3. Each work roll is supported by a back-up roll 4. The dimension of the roll gap 3 is adjustable by means of system 5. System 5 comprises a screw adjustment 6 for relatively slow, coarse adjustment, connected in series with a piezo actuator 7 for accurate adjustment at a speed, for example, up to 60 Hz and an error of 0.5 $\mu$m over distances of, from example, between 10 $\mu$m and 100 $\mu$m. In this arrangement, the piezo actuator 7 has to transmit the roll forces usually encountered in cold rolling, which may be about 5000 kN if the rolling installation is used to roll steel strip. The installation may include one or more sensors 8, coupled to a control loop 9, in order, for example by means of feed back or feed forward, to control the size of the roll gap. Such control loops are generally known. Such a system is described, for example, in patent EP-B-0.3.91.658.

The piezo actuator 7 comprises at least 1 piezo element of piezoelectric material, for example of a multilayer type.

Figure 2:
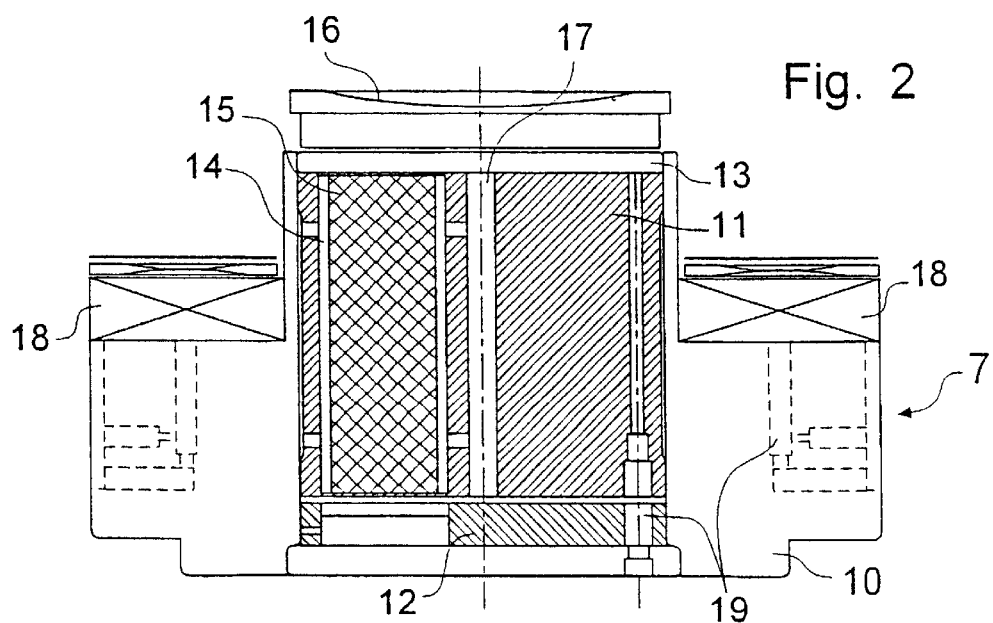
FIG. 2 shows a piezo actuator in combination with bias springs, partly as a view and partly sectionally.

FIG. 2, partly as a view and partly sectionally, depicts a piezo actuator 7, a metal block 11 being positioned between the end plates 12 and 13, within which block five ducts 14 are disposed in the force direction. Located within these ducts are stacked piezo elements 15. The stacks of piezo elements 15 have a height of 170 mm and a diameter of 50 mm. By applying a voltage of, for example, 1000 volts across such an element, a deflection of 100 $\mu$m is obtained.

Piezo actuator 7 is located between the screw spindle adjustment means 6 and work roller or back-up roller chocks. It should be noted that it is also possible to cause the piezo actuator to act on the hydraulic fluid of a hydraulic roll adjustment system, for example by incorporating the actuator in one of the walls of the pressure vessel of the hydraulic system, so that the piezo actuator effects a displacement of the hydraulic fluid and a pressure change therein, which leads to accurate adjustment of the cluster mill.

Figure 3:
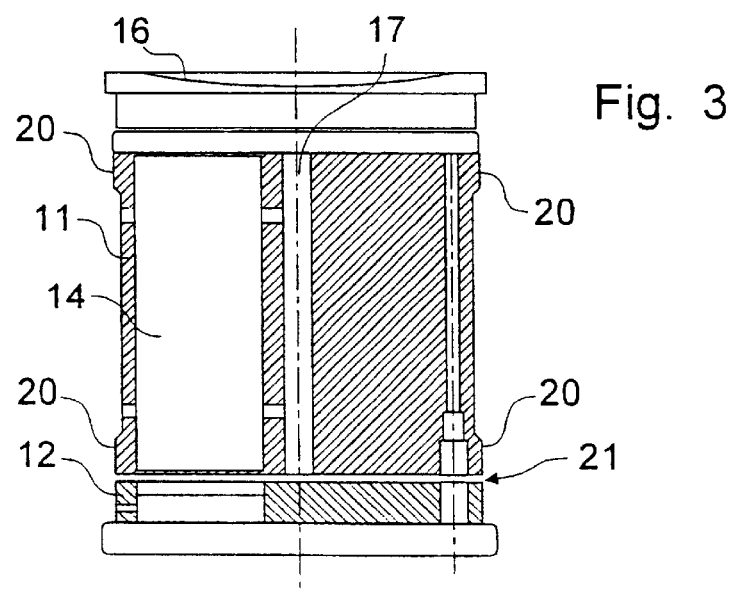
FIG. 3 shows the block of a piezo actuator in detail.

The top end plate 13 is covered by a thrust bearing 16 (see FIGS. 2 and 3). This thrust bearing consists of two spherical-zone surfaces, thereby achieving good force transmission in the piezo actuator as a whole, i.e. also in the separate piezo elements 15. The bottom end plate 12 is enclosed within the actuator block 10, said actuator block 10 itself being linked, with very little play, to the bearing block within which roll 4 is turning. Block 11 is provided with a main duct 17 which is connected to a source of air or some other gas, under pressure. Via side ducts, main duct 17 communicates with the ducts 14 within which the piezo elements 15 are located. With the aid of the air thus flowing through the ducts 14 it is possible to keep the piezo elements at a constant temperature and to avoid the ingress of splashed fluid. This ensures that piezo elements respond reliably and reproducibly to an electrical voltage applied.

As depicted in FIG. 2, the actuator block 10 also has bias springs 18 positioned thereon. These bias springs are able to absorb part of the roll force, the piezo elements thus being less heavily loaded.

As a result, the roll force can be absorbed using fewer piezo elements. Reference number 19 indicates the locations where sensors 8 (see FIG. 1) can be installed, with the option of these sensors being incorporated in the control loop 9.

FIG. 3 further depicts details of the assembly of block 11 and the end plates 12 and 13. In particular, the figure shows projecting edges 20 of the block 11, which allow a close fit with respect to actuator block 10. This prevents block 11 from tilting with respect to actuator block 10, and also prevents transverse forces from being transmitted to the piezo elements. Between block 11 and the bottom plate 12, in the unloaded state of the piezo elements, there is an open gap 21. Piezo element 15 in this situation then abuts bottom plate 12 and top plate 13. Not until the roll force becomes so high that the piezo elements are subjected to the maximum permissible pressure will the air gap 21 be closed. Then, as a result of bottom plate 12 lying against block 11, any further strain increase in the piezo element is blocked.

Figure 4:
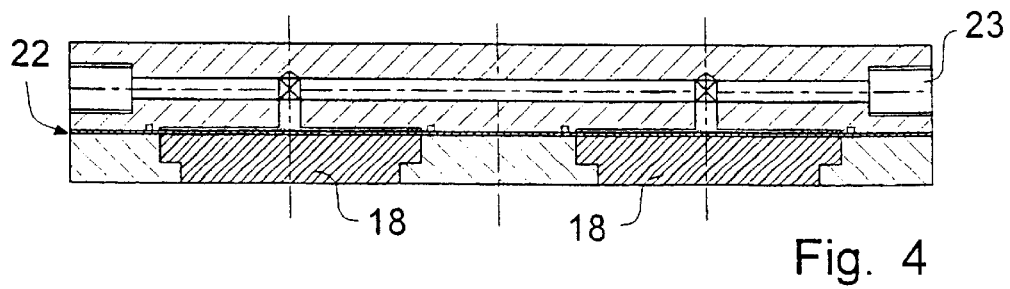
FIG. 4 shows bias springs in longitudinal section as seen from the side.

FIG. 4 schematically depicts, in longitudinal section, two hydraulic bias springs 18. Between these springs 18 and a hydraulic chamber 23 a membrane 22 is located. The bias springs 18 are able to force the membrane away against the oil pressure. By connecting hydraulic system 23 to a sufficiently large buffer vessel (not shown), a hydraulic spring having low stiffness can be implemented. This means that if the hydraulic bias springs 18 are moved, the hydraulic counter-pressure increases only slightly, thus reducing only slightly the effect of the piezo actuator. The bias springs do absorb part of the total roll force. Given a maximum travel of the piezo elements of, for example, 100 $\mu$m, the hydraulic bias springs can, for example, have a travel of 250 $\mu$m. To ensure that said travel of 250 $\mu$m spans the entire working range of the piezos, the hydraulic bias springs 18 can be built up to the proper height by means of shims.

With one embodiment of a piezo actuator of the illustrated type it was observed that the maximum travel of the piezo actuator for frequencies up to about 60 Hz was 100 $\mu$m. When the frequency increased to 100 Hz, the maximum travel fell to about 50 $\mu$m.

Consequently, the piezo actuator proved to have amply sufficient travel for controlled compensation for normal non-circularities of the rollers. These, as a matter of fact are in the order of 70 $\mu$m in conventional cold-rolling mills.

Many cold-rolling mills for steel also exhibit a hum frequency. This hum frequency is often around 200 Hz. At this frequency, the piezo actuator proved still to have sufficient travel to be capable of being used effectively as a vibration insulator. Even up to a frequency range up to 500 Hz, the piezo actuator still has the capability of controlling the position of the rolls, whereas with the conventional hydraulic control systems this ceases at frequencies as low as up to 20 Hz.

What is claimed is:

1. Device for accurate position control of a force-transmitting system comprising at least one solid-state piezo actuator (7), wherein the piezo actuator (7)comprises a metal block (11) which is positioned between end plates (12, 13) and in the direction of the force has at least one duct (14) into each of which a stacked piezo element (15) fits, the height of the block (11) being shorter than the length of each stacked piezo element (15) and the difference in height corresponding to the shortening of each stacked piezo element (15) under the maximum permissible axial load acting thereon, and wherein the piezo actuator (7) is incorporated transversely to the direction of force, without play, in such a way into an element of the force-transmitting system that only a force in the axial direction of the ducts (14) can be transmitted to each stacked piezo element (15).

2. Device according to claim 1, wherein at least one of the end plates (12, 13) is constructed as a thrust bearing.

3. Device according to claim 1, wherein each duct (14) is connected (17) to a source of a gas for controlling the temperature and the humidity level within each duct.

4. Device according to claim 1, wherein the piezo actuator (7) is also coupled to at least one bias spring (18), the bias force not being strongly dependent on the travel of the piezo actuator (7).

5. Device according to claim 4, claim 1, wherein each bias spring (18) is a hydraulic membrane actuator.

6. Device according to claim 5, wherein at least one member of the group consisting of the piezo actuator (7) and said at least one bias spring (18) are provided with height sensors (8) whose signal is fed to a control system of at least one member of the group consisting of the electrical actuation of each stacked piezo element (15) and the hydraulic actuation of the bias springs (18).

7. Device according to claim 1, wherein the force-transmitting system is a cluster mill (1).

8. Device according to claim 7, wherein the piezo actuator (7) is incorporated in a bearing housing.

9. Device according to claim 1, wherein the at least one piezo actuator (7) is provided with height sensors (8) whose signal is fed to a control system of the electrical actuation of each stacked piezo element.

10. Device according to claim 2, wherein at least one of the end plates (12, 13) is constructed as a thrust bearing.

11. Device according to claim 2, wherein each duct (14) is connected (17) to a source of a gas for controlling the temperature and the humidity level within each duct.

12. Device according to claim 2, wherein the piezo actuator (7) is also coupled to at least one bias spring (18), the bias force not being strongly dependent on the travel of the piezo actuator (7).

13. Device according to claim 12, claim 1, wherein each bias spring (18) is a hydraulic membrane actuator.

14. Device according to claim 13, wherein at least one member of the group consisting of the piezo actuator (7) and said at least one bias spring (18) are provided with height sensors (8) whose signal is fed to a control system of at least one member of the group consisting of the electrical actuation of each stacked piezo element (15) and the hydraulic actuation of the bias springs (18).

15. Device according to claim 1, wherein the force-transmitting system is a cluster mill (1).

16. Device according to claim 15, wherein the piezo actuator (7) is incorporated in a bearing housing.

17. Device according to claim 2, wherein the at least one piezo actuator (7) is provided with height sensors (8) whose signal is fed to a control system of the electrical actuation of each stacked piezo element.

* * * * *

UNITED STATES PATENT AND TRADEMARK OFFICE
CERTIFICATE OF CORRECTION

PATENT NO. : 6,373,171 B1  
DATED : April 16, 2002  
INVENTOR(S) : Johannes De Lange et al.

It is certified that error appears in the above-identified patent and that said Letters Patent is hereby corrected as shown below:

<u>Title page,</u>  
Item [75], please correct third inventors name to read:  
-- Johan Jacob Hendrik Wesselink. --

Signed and Sealed this

Eleventh Day of June, 2002

Attest:

Attesting Officer

JAMES E. ROGAN  
*Director of the United States Patent and Trademark Office*